United States Patent
Kim et al.

(10) Patent No.: US 10,770,515 B2
(45) Date of Patent: Sep. 8, 2020

(54) DISPLAY DEVICE INCLUDING COLOR FILTERS

(71) Applicant: LG Display Co., Ltd., Seoul (KR)

(72) Inventors: JongSung Kim, Paju-si (KR); Ho-Jin Kim, Seoul (KR); SeungMin Baik, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 70 days.

(21) Appl. No.: 15/831,060

(22) Filed: Dec. 4, 2017

(65) Prior Publication Data

US 2018/0182814 A1 Jun. 28, 2018

(30) Foreign Application Priority Data

Dec. 22, 2016 (KR) .................... 10-2016-0176785

(51) Int. Cl.
*H01L 27/32* (2006.01)

(52) U.S. Cl.
CPC ........ *H01L 27/322* (2013.01); *H01L 27/3244* (2013.01); *H01L 2251/5315* (2013.01)

(58) Field of Classification Search
CPC ............... H01L 27/322; H01L 27/3244; H01L 2251/5315
See application file for complete search history.

(56) References Cited

U.S. PATENT DOCUMENTS

| | | | | |
|---|---|---|---|---|
| 6,025,899 A | * | 2/2000 | Fukunaga | ......... G02F 1/133516 349/115 |
| 7,187,426 B2 | * | 3/2007 | Kaneko | ............ G02F 1/133512 349/149 |
| 2006/0038953 A1 | * | 2/2006 | Moriya | ............. G02F 1/133514 349/144 |
| 2007/0291335 A1 | | 12/2007 | Lee et al. | |
| 2015/0362795 A1 | * | 12/2015 | Chen | .................. G02F 1/133512 349/42 |
| 2016/0025302 A1 | * | 1/2016 | Shiratori | ............. H01L 27/3213 362/231 |
| 2016/0322444 A1 | * | 11/2016 | Kang | .................... H01L 27/322 |

FOREIGN PATENT DOCUMENTS

KR 10-1229288 B1 2/2013

* cited by examiner

*Primary Examiner* — Tuan A Hoang
(74) *Attorney, Agent, or Firm* — Birch, Stewart, Kolasch & Birch, LLP (57) ABSTRACT

A display can include a plurality of pixels including a first pixel, a second pixel and a third pixel; a first color filter overlapping the first and second pixels; a second color filter overlapping the first and third pixels; and a third color filter overlapping the second and third pixels.

19 Claims, 6 Drawing Sheets

DISPLAY DEVICE INCLUDING COLOR FILTERS

CROSS REFERENCE TO RELATED APPLICATIONS

This application claims the benefit of the Korean Patent Application No. 10-2016-0176785 filed in the Republic of Korea on Dec. 22, 2016, which is hereby incorporated by reference for all purposes as if fully set forth herein.

BACKGROUND OF THE INVENTION

Field of the Invention

The present invention relates to a display device including color filters.

Discussion of the Related Art

Recently, with the advancement of the information age, a demand for a display device for displaying an image has been increased in various forms. Therefore, various display devices such as liquid crystal display (LCD) devices, plasma display panel (PDP) devices, and organic light emitting display (OLED) devices have been used.

Among the display devices, the organic light emitting display device is a self-light emitting device, and has advantages in that a viewing angle and a contrast ratio are more excellent than those of the liquid crystal display (LCD) device. Also, since the organic light emitting display device does not require a backlight, it is advantageous that the organic light emitting display device is able to be thin and lightweight and has low power consumption. Furthermore, the organic light emitting display device has advantages in that it may be driven at a low direct current voltage, has a fast response speed, and especially has a low manufacturing cost.

The organic light emitting display device includes pixels, each of which includes an organic light emitting diode, and a bank for partitioning the pixels to define the pixels. The bank may serve as a pixel definition film. The organic light emitting diode includes an anode electrode, a hole transporting layer, an organic light emitting layer, an electron transporting layer, and a cathode electrode. In this situation, if a high potential voltage is applied to the anode electrode and a low potential voltage is applied to the cathode electrode, holes and electrons are moved to the organic light emitting layer through the hole transporting layer and the electron transporting layer, respectively, and are combined with each other in the organic light emitting layer to emit light.

The organic light emitting diode may include red, green and blue organic light emitting diodes emitting red light, green light and blue light, or may include only a white organic light emitting diode emitting white light. If the organic light emitting diode includes a white organic light emitting diode only, the organic light emitting display device includes red, green and blue color filters for displaying red, green and blue. Also, the organic light emitting display device may include red, green and blue color filters to reduce external light reflection or calibrate color coordinates even when the organic light emitting diode includes red, green and blue organic light emitting diodes.

Also, a small sized organic light emitting display device of high resolution has been recently applied to a head mounted display for realizing virtual reality (VR) or a mobile device. Since pixels of the small sized organic light emitting display device of high resolution are formed at a small size, a color filter formed to correspond to each of the pixels may be formed with a narrow width. For example, the width of the color filter of the organic light emitting display device applied to the head mounted display may be 10 μm or less. Since adhesion of the color filter depends on its area, if the color filter is formed with a narrow width, adhesion of the color filter is deteriorated. For this reason, a problem may occur in that the color filter is peeled away or torn out.

SUMMARY OF THE INVENTION

Accordingly, the present invention is directed to a display device including color filters that substantially obviates one or more problems due to limitations and disadvantages of the related art.

An advantage of the present invention is to provide a display device that may prevent a color filter from being peeled away or torn out.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a display device comprising first to third pixels; a first color filter arranged to overlap the first and second pixels; a second color filter arranged to overlap the first and third pixels; and a third color filter arranged to overlap the second and third pixels.

It is to be understood that both the foregoing general description and the following detailed description of the present invention are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

The same reference numbers substantially mean the same elements through the specification. In the following description of the present invention, if detailed description of elements or functions known in respect of the present invention is not relevant to the subject matter of the present invention, the detailed description will be omitted. The terms disclosed in this specification should be understood as follows.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In a situation where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as "upon," "above," "below" and "next to," one or more portions may be arranged between two other portions unless "just" or "direct" is used.

In describing a time relationship, for example, when the temporal order is described as "after," "subsequent," "next," and "before," a situation which is not continuous may be included unless "just" or "direct" is used.

It will be understood that, although the terms "first," "second," etc. may be used herein to describe various elements, these elements should not be limited by these terms. These terms are only used to distinguish one element from another element. Therefore, a first element could be termed a second element, and, similarly, a second element could be termed a first element, without departing from the scope of the present invention.

"X-axis direction," "Y-axis direction" and "Z-axis direction" should not be construed by a geometric relation only of a mutual vertical relation, and may have broader directionality within the range that elements of the present invention may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, the preferred embodiments of the present invention will be described in detail with reference to the accompanying drawings.

Figure 1:
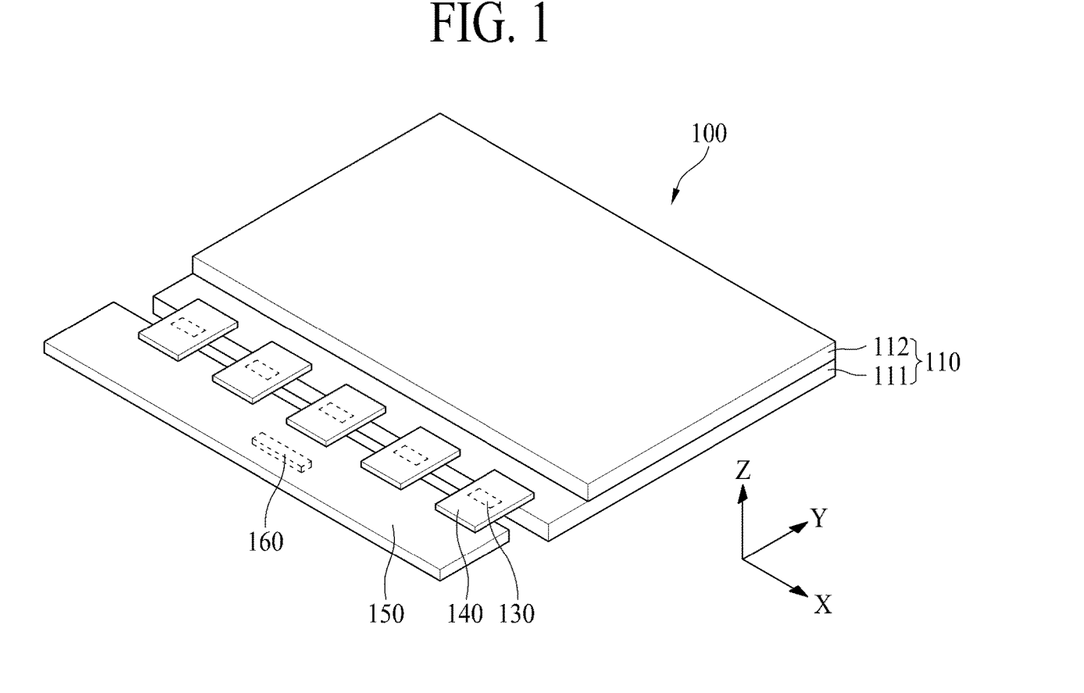
FIG. 1 is a perspective view illustrating a display device according to one embodiment of the present invention.
Figure 2:
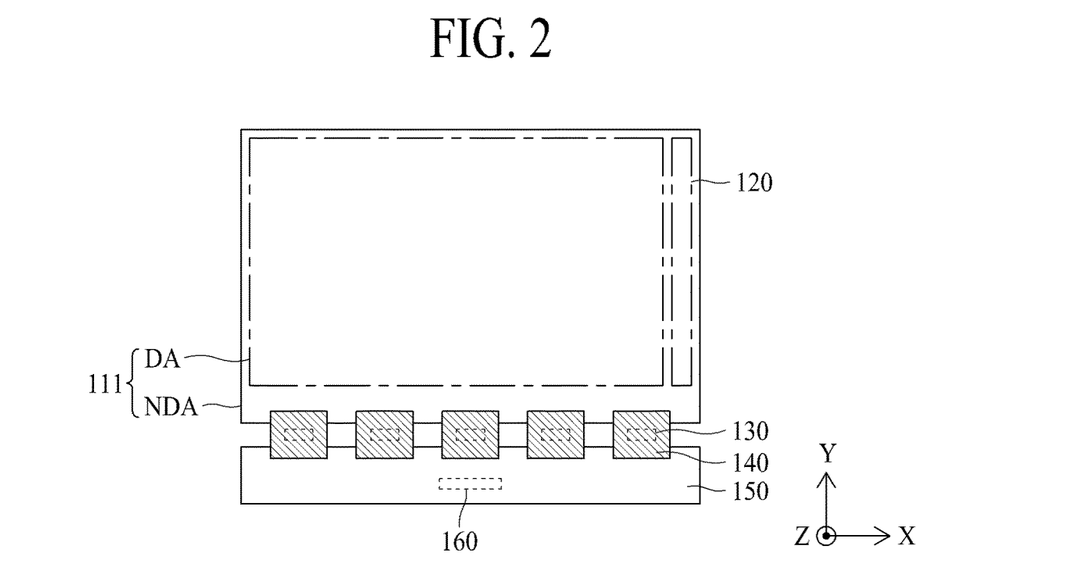
FIG. 2 is a plane view illustrating a first substrate, a gate driver, a source drive IC, a flexible film, a circuit board, and a timing controller of FIG. 1.

FIG. 1 is a perspective view illustrating a display device according to one embodiment of the present invention. FIG. 2 is a plane view illustrating a first substrate, a gate driver, a source drive IC, a flexible film, a circuit board, and a timing controller of FIG. 1.

Referring to FIGS. 1 and 2, the organic light emitting display device 100 according to one embodiment of the present invention includes a display panel 110, a gate driver 120, a source drive integrated circuit (hereinafter, referred to as "IC") 130, a flexible film 140, a circuit board 150, and a timing controller 160.

The display panel 110 includes a first substrate 111 and a second substrate 112. The second substrate 112 may be an encapsulation substrate. The first substrate 111 may be a plastic film or a glass substrate. The second substrate 112 may be a plastic film, a glass substrate, or an encapsulation film (protective film).

Gate lines, data lines and pixels are formed on one surface of the first substrate 111, which faces the second substrate 112. The pixels are provided in an area defined by a crossing structure of the gate lines and the data lines.

Each of the pixels may include a thin film transistor, and an organic light emitting diode that includes a first electrode, an organic light emitting layer, and a second electrode. Each of the pixels supplies a predetermined current to the organic light emitting diode in accordance with a data voltage of the data line if a gate signal is input from the gate line by using the thin film transistor. For this reason, the organic light emitting diode of each of the pixels may emit light with a predetermined brightness in accordance with the predetermined current. A structure of each of the pixels will be described later with reference to FIGS. 3 and 4.

The display panel 110 may be categorized into a display area DA where the pixels are formed to display an image and a non-display area NDA where an image is not displayed, as shown in FIG. 2. The gate lines, the data lines and the pixels may be formed on the display area DA. The gate driver 120 and pads may be formed on the non-display area NDA.

The gate driver 120 supplies gate signals to the gate lines in accordance with a gate control signal input from the timing controller 160. The gate driver 120 may be formed on the non-display area NDA outside one side or both sides of the display area DA of the display panel 110 in a gate driver in panel (GIP) mode. Alternatively, the gate driver 120 may be fabricated of a driving chip, packaged in a flexible film and attached to the non-display area NDA outside one side or both sides of the display panel 110 in a tape automated bonding (TAB) mode.

The source drive IC 130 receives digital video data and a source control signal from the timing controller 160. The source drive IC 130 converts the digital video data to analog data voltages in accordance with the source control signal and supplies the analog data voltages to the data lines. If the source drive IC 130 is fabricated of a driving chip, the source drive IC 130 may be packaged in the flexible film 140 in a chip on film (COF) or chip on plastic (COP) mode.

Pads such as data pads may be formed on the non-display area NDA of the display panel 110. Lines which connect the pads with the source drive IC 130 and lines which connect the pads with lines of the circuit board 150 may be formed in the flexible film 140. The flexible film 140 may be attached onto the pads by an anisotropic conducting film, whereby the pads may be connected with the lines of the flexible film 140.

The circuit board 150 may be attached to the flexible films 140. A plurality of circuits comprised of driving chips may be packaged in the circuit board 150. For example, the timing controller 160 may be packaged in the circuit board 150. The circuit board 150 may be a printed circuit board or a flexible printed circuit board.

The timing controller 160 receives digital video data and a timing signal from an external system board through a cable of the circuit board 150. The timing controller 160 generates a gate control signal for controlling an operation timing of the gate driver 120 and a source control signal for controlling the source drive ICs 130 on the basis of the timing signal. The timing controller 160 supplies the gate control signal to the gate driver 120, and supplies the source control signal to the source drive ICs 130.

Figure 3:
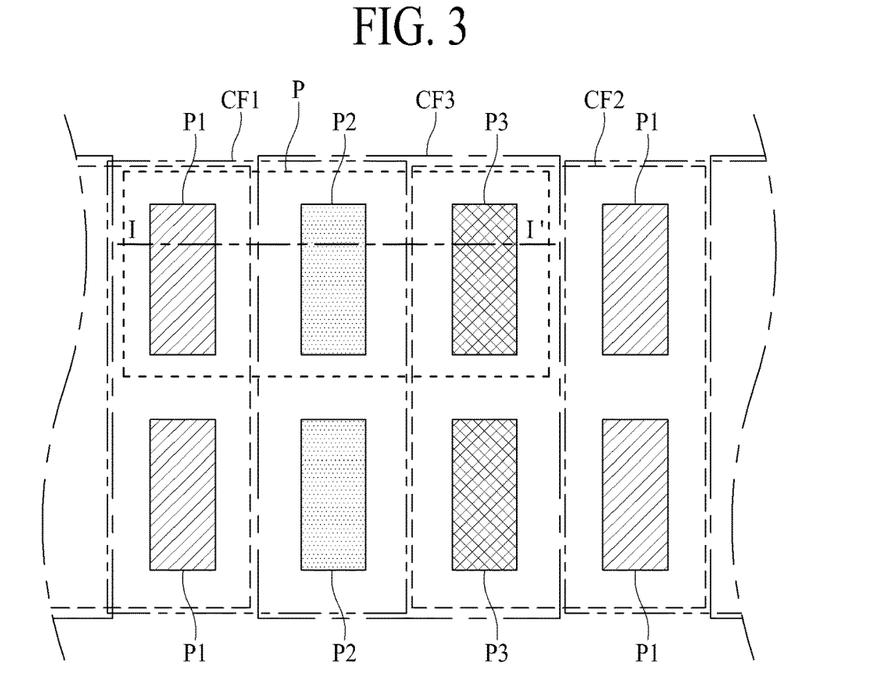
FIG. 3 is a plane view illustrating arrangement of pixels and color filters of a display area.

FIG. 3 is a plane view illustrating arrangement of pixels and color filters of a display area.

For convenience of description, first to third pixels P1, P2 and P3 and first to third color filters CF1, CF2 and CF3 are only shown in FIG. 3.

Referring to FIG. 3, Each of the first to third pixels P1, P2 and P3 indicates an area where a first electrode corresponding to an anode electrode, an organic light emitting layer, and a second electrode corresponding to a cathode electrode are sequentially deposited and holes from the first electrode are combined with electrons from the second electrode in the organic light emitting layer to emit light. The first to third pixels P1, P2 and P3 can be subpixels defining one unit pixel.

The organic light emitting layer may be formed as a common layer in the first to third pixels P1, P2 and P3 to emit white light. Alternatively, the organic light emitting layer may be formed in each of the first to third pixels P1, P2 and P3. In this situation, the first pixel P1 may include a first organic light emitting layer for emitting light of a first color, the second pixel P2 may include a second organic light emitting layer for emitting light of a second color, and the third pixel P3 may include a third organic light emitting layer for emitting light of a third color. For example, the light of the first color may be red light, the light of the second color may be green light, and the light of the third color may be blue light.

A first color filter CF1 is arranged to overlap the first and second pixels P1 and P2, a second color filter CF2 is arranged to overlap the first and third pixels P1 and P3, and a third color filter CF3 is arranged to overlap the second and third pixels P2 and P3. For this reason, the first to third color filters CF1, CF2 and CF3 may be arranged to overlap one another. For example, a part of the first color filter CF1 may be arranged to overlap the second color filter CF2, and the other part of the first color filter CF1 may be arranged to overlap the third color filter CF3. Also, a part of the second color filter CF2 may be arranged to overlap the first color filter CF1, and the other part of the second color filter CF2 may be arranged to overlap the third color filter CF3. Also, a part of the third color filter CF3 may be arranged to overlap the first color filter CF1, and the other part of the third color filter CF3 may be arranged to overlap the second color filter CF2. Finally, the first pixel P1 may be overlapped with the first and second color filters CF1 and CF2, the second pixel P2 may be overlapped with the first and third color filters CF1 and CF3, and the third pixel P3 may be overlapped with the second and third color filters CF2 and CF3.

As described above, the color filters may be formed to overlap the plurality of pixels in the embodiment of the present invention, whereby each width of the color filters may be widened. Since adhesion of each color filter depends on an area of the color filter, the color filter may be formed with a wide width to enhance its adhesion. Therefore, in the embodiment of the present invention, the color filter may be prevented from being peeled away or torn out.

Figure 4:
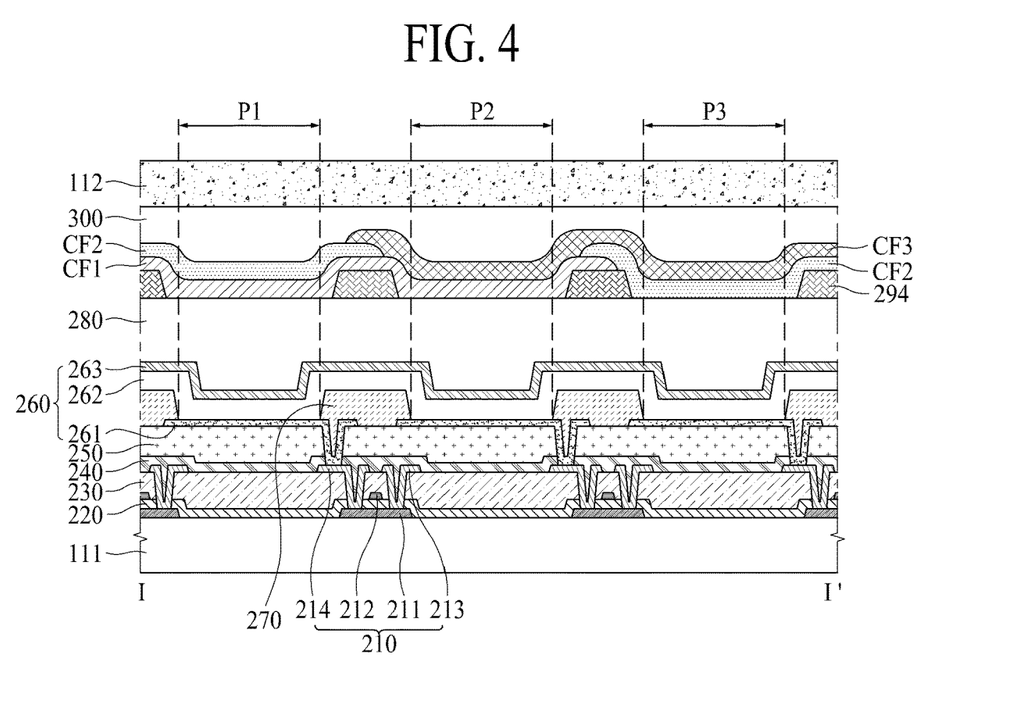
FIG. 4 is a cross-sectional view illustrating an example of line I-I' of FIG. 3.

FIG. 4 is a cross-sectional view illustrating an example of line I-I' of FIG. 3.

Referring to FIG. 4, thin film transistors 210 are formed on the first substrate 111. A buffer film may be formed on the first substrate 111 before the thin film transistors 210 are formed. The buffer film may be formed on the first substrate 111 to protect the thin film transistors 210 and organic light emitting diodes 260 from water permeated through the first substrate 111 which is vulnerable to moisture permeability. The buffer film may be made of a plurality of inorganic films which are deposited alternately. For example, the buffer film may be formed of a multi-layered film of one or more inorganic films of a silicon oxide (SiOx) film, a silicon nitride (SiNx) film and SiON, which are deposited alternately. The buffer film may be omitted.

The thin film transistor 210 is formed on the buffer film. The thin film transistor 210 includes an active layer 211, a gate electrode 212, a source electrode 213, and a drain electrode 214. Although the thin film transistor 210 is formed in a top gate mode in which the gate electrode 212 is arranged above the active layer 211 as shown in FIG. 4, it is to be understood that the thin film transistor of the present invention is not limited to the top gate mode. That is, the thin film transistor 210 may be formed in a bottom gate mode in which the gate electrode 212 is arranged below the active layer 211 or a double gate mode in which the gate electrode 212 is arranged above and below the active layer 211.

The active layer 211 is formed on the buffer film. The active layer 211 may be formed of a silicon based semiconductor material or an oxide based semiconductor material. A light-shielding layer for shielding external light entering the active layer 211 may be formed between the buffer film and the active layer 211.

A gate insulating film 220 may be formed on the active layer 211. The gate insulating film 220 may be formed of an inorganic film, for example, a silicon oxide (SiOx) film, a silicon nitride (SiNx) film or a multi-layered film of the silicon oxide (SiOx) film and the silicon nitride (SiNx) film.

The gate electrode 212 and the gate line may be formed on the gate insulating film 220. The gate electrode 212 and the gate line may be formed of a single layer or multi-layer comprised of any one of Mo, Al, Cr, Au, Ti, Ni, Nd and Cu or their alloy.

An inter-layer dielectric film 230 may be formed on the gate electrode 212 and the gate line. The inter-layer dielectric film 230 may be formed of an inorganic film, for example, a silicon oxide (SiOx) film, a silicon nitride (SiNx) film, or a multi-layered film of the silicon oxide film and the silicon nitride film.

The source electrode 213, the drain electrode 214 and the date line may be formed on the inter-layer dielectric film 230. Each of the source electrode 213 and the drain electrode 214 may be connected to the active layer 211 through a contact hole that passes through the gate insulating film 220 and the inter-layer dielectric film 230. Each of the source electrode 213, the drain electrode 214 and the data line may be formed of a single layer or multi-layer comprised of any one of Mo, Al, Cr, Au, Ti, Ni, Nd and Cu or their alloy.

A passivation film 240 may be formed on the source electrode 213, the drain electrode 214 and the data line to insulate the thin film transistor 210. The passivation film 240 may be formed of an inorganic film, for example, a silicon oxide film (SiOx), a silicon nitride film (SiNx), or a multi-layered film of the silicon oxide film and the silicon nitride film.

A planarization film 250 for planarizing a step difference due to the thin film transistor 210 may be formed on the passivation film 240. The planarization film 250 may be formed of an organic film such as acrylic resin, epoxy resin, phenolic resin, polyamide resin, and polyimide resin.

An organic light emitting diode 260 and a bank 270 are formed on the planarization film 250. The organic light emitting diode 260 includes a first electrode 261, an organic light emitting layer 262, and a second electrode 263. The first electrode 261 may be an anode electrode, and the second electrode 263 may be a cathode electrode.

The first electrode 261 may be formed on the planarization film 250. The first electrode 261 is connected to the source electrode 213 of the thin film transistor 210 through a contact hole that passes through the passivation film 240 and the planarization film 250. In this situation, the first electrode 261 may be formed of a metal material having high reflectivity such as a deposition structure (Ti/Al/Ti) of Al and Ti, a deposition structure (ITO/Al/ITO) of Al and ITO, an APC alloy, and a deposition structure (ITO/APC/ITO) of APC alloy and ITO. The APC alloy is an alloy of Ag, Pd and Cu.

The bank 270 may be formed on the planarization film 250 to cover an edge of the first electrode 261, thereby partitioning the first to third pixels P1, P2 and P3. That is, the bank 270 serves as a pixel definition film for defining the first to third pixels P1, P2 and P3.

Each of the first to third pixels P1, P2 and P3 indicates an area where a first electrode corresponding to an anode electrode, an organic light emitting layer, and a second electrode corresponding to a cathode electrode are sequentially deposited and holes from the first electrode are combined with electrons from the second electrode in the organic light emitting layer to emit light. In this situation, since the area where the bank 270 is formed does not emit light, this area may be defined as a non-emission area.

The bank 270 may be formed of an organic film such as acrylic resin, epoxy resin, phenolic resin, polyamide resin, and polyimide resin.

The organic light emitting layer 262 is formed on the first electrode 261 and the bank 270. The organic light emitting layer 262 is a common layer commonly formed on the first to third pixels P1, P2 and P3, and may be a white light emitting layer for emitting white light. In this situation, the organic light emitting layer 262 may be formed in a tandem structure of two stacks or more. Each of the stacks may include a hole transporting layer, at least one light emitting layer, and an electron transporting layer. Also, a charge generating layer may be formed between the stacks.

The hole transporting layer serves to actively deliver holes injected from the first electrode 261 or the charge generating layer to the organic light emitting layer 262. The organic light emitting layer 262 may be formed of an organic material that includes phosphor or fluorescent material, whereby predetermined light may be emitted. The electron transporting layer serves to actively deliver electrons injected from the second electrode 263 or the charge generating layer to the organic light emitting layer 262.

The charge generating layer may include an n type charge generating layer arranged to adjoin the lower stack, and a p type charge generating layer formed on the n type charge generating layer and arranged to adjoin the upper stack. The n type charge generating layer injects electrons into the lower stack, and the p type charge generating layer injects holes into the upper stack. The n type charge generating layer may be an organic layer doped with alkali metal such as Li, Na, K or Cs, or alkali earth metal such as Mg, Sr, Ba or Ra. The p type charge generating layer may be an organic layer of an organic host material doped with a dopant, wherein the organic host material has hole transportation capability.

Although the organic light emitting layer 262 is a common layer commonly formed in the first to third pixels P1, P2 and P3 and is a white light emitting layer for emitting white light in FIG. 4, the embodiment of the present invention is not limited to the example of FIG. 4. That is, the organic light emitting layer 262 can be individually formed in each of the first to third pixels P1, P2 and P3. In this situation, the first pixel P1 may include a first light emitting layer for emitting light of a first color, the second pixel P2 may include a second light emitting layer for emitting light of a second color, and the third pixel P3 may include a third light emitting layer for emitting light of a third color. In this situation, the light of the first color may be red light, the light of the second color may be green light, and the light of the third color may be blue light.

The second electrode 263 is formed on the organic light emitting layer 262. The second electrode 263 is a common layer commonly formed in the first to third pixels P1, P2 and P3. The second electrode 263 may be formed of a transparent conductive material (TCO) such as ITO and IZO, which may transmit light, or a semi-transmissive conductive material such as Mg, Ag, and alloy of Mg and Ag. If the second electrode 263 is formed of a semi-transmissive conductive material, light-emission efficiency may be enhanced by micro cavity. A capping layer may be formed on the second electrode 263.

An encapsulation film 280 is formed on the second electrode 263. The encapsulation film 280 serves to prevent oxygen or water from being permeated into the organic light emitting layer 262 and the second electrode 263. The encapsulation film 280 may include at least one inorganic film. The inorganic film may be formed of a silicon nitride, an aluminum nitride, a zirconium nitride, a titanium nitride, a hafnium nitride, a tantalum nitride, a silicon oxide, an aluminum oxide, or a titanium oxide. Also, the encapsulation film 280 may further include at least one organic film to prevent particles from being permeated into the organic light emitting layer 262 and the second electrode 263 by passing through the inorganic film.

First to third color filters CF1, CF2 and CF3 and a black matrix 294 are formed on the encapsulation film 280. If the first to third color filters CF1, CF2 and CF3 are directly formed on the encapsulation film 280, it is not required to align the first substrate 111 and the second substrate 112 when the first substrate 111 and the second substrate 112 are bonded to each other, and a separate adhesive layer is not required. Therefore, it is advantageous that a thickness of the display panel may be reduced. In this situation, the first to third color filters CF1, CF2 and CF3 may be formed at a process of a low temperature less than 100° C. to prevent the organic light emitting layer 262 from being damaged.

The black matrix 294 may be arranged at a boundary between the first and second color filters CF1 and CF2, a boundary between the first and third color filters CF1 and CF3, and a boundary between the second and third color filters CF2 and CF3 to prevent mixing of colors from occurring. Also, the black matrix 294 may be overlapped with all of the first color filter CF1, the second color filter CF2 and the third color filter CF3.

Also, the black matrix 294 may be arranged to overlap the bank 270 to minimize reduction of an emission area, which is caused by the black matrix 294.

If the black matrix 294 is formed of an organic film, the black matrix 294 may include a carbon based black pigment. If the black matrix 294 is formed of an inorganic film, the black matrix 294 may include an opaque metal material such as Cr, which has high light absorption ratio.

The first color filter CF1 may be arranged to overlap the first and second pixels P1 and P2, the second color filter CF2 may be arranged to overlap the first and third pixels P1 and P3, and the third color filter CF3 may be arranged to overlap the second and third pixels P2 and P3. For this reason, the first to third color filters CF1, CF2 and CF3 may be arranged to overlap one another. For example, a part of the first color filter CF1 may be arranged to overlap the second color filter CF2, and the other part of the first color filer CF1 may be arranged to overlap the third color filter CF3. Also, a part of the second color filter CF2 may be arranged to overlap the first color filter CF1, and the other part of the second color filter CF2 may be arranged to overlap the third color filter CF3. Also, a part of the third color filter CF3 may be arranged to overlap the first color filter CF1, and the other part of the third color filter CF3 may be arranged to overlap the second color filter CF2. Finally, the first pixel P1 may be overlapped with the first and second color filters CF1 and CF2, the second pixel P2 may be overlapped with the first and third color filters CF1 and CF3, and the third pixel P3 may be overlapped with the second and third color filters CF2 and CF3. In this situation, as shown in FIG. 4, the first color filter CF1 may be arranged on the black matrix 294, the second color filter CF2 may be arranged on the black matrix 294 and the first color filter CF1, and the third color filter CF3 can be arranged on and in contact with the first and second color filters CF1 and CF2.

An overcoat layer 300 for planarizing a step difference caused by the first to third color filters CF1 to CF3 may be formed on the first to third color filters CF1 to CF3.

The second substrate 112 may be attached onto the overcoat layer 300. The second substrate 112 may be a plastic film, a glass substrate, or an encapsulation film (protective film).

As described above, in the embodiment of the present invention, the color filters may be formed to overlap the plurality of pixels, whereby each width of the color filters may be widened. Since adhesion of each color filter depends on an area of the color filter, the color filter may be formed with a wide width to enhance its adhesion. Therefore, in the embodiment of the present invention, the color filter may be prevented from being peeled away or torn out.

Figure 7:
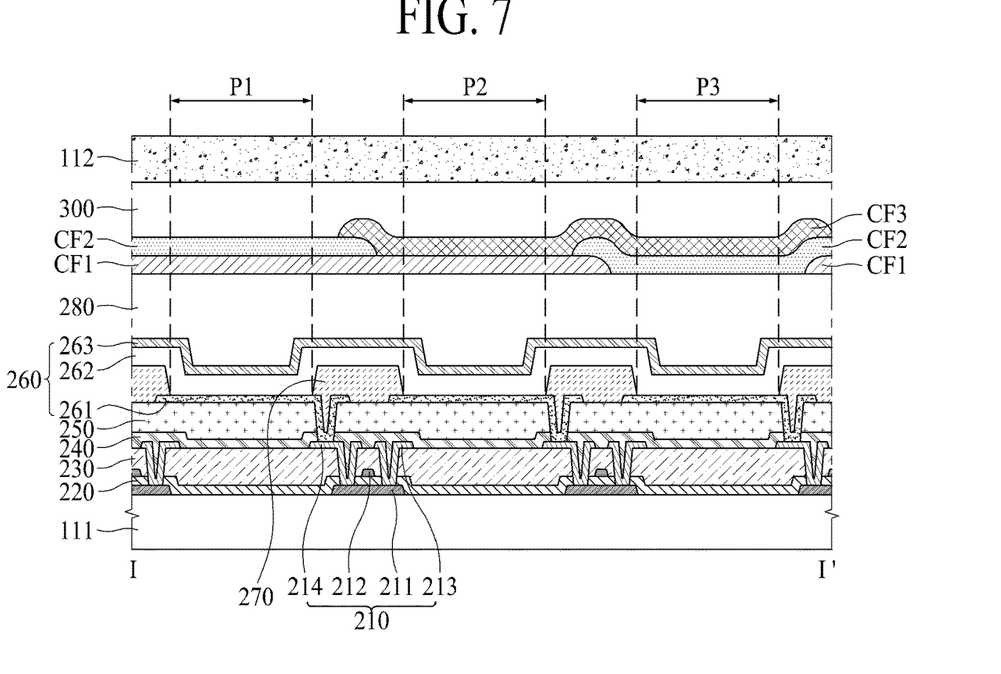
FIG. 7 is a cross-sectional view illustrating another example of line I-I' of FIGS. 3 and 4.

In addition, the black matrix 294 may be overlapped with all of the first to third color filters CF1, CF2 and CF3 as shown in FIG. 4. In this situation, light of the organic light emitting layer 262 does not transmit through all of the first to third color filters CF1, CF2 and CF3. Therefore, since the areas where the first to third color filters CF1, CF2 and CF3 are overlapped with one another may similarly serve as the black matrix 294, the black matrix 294 may be omitted as shown in FIG. 7.

Figure 8:
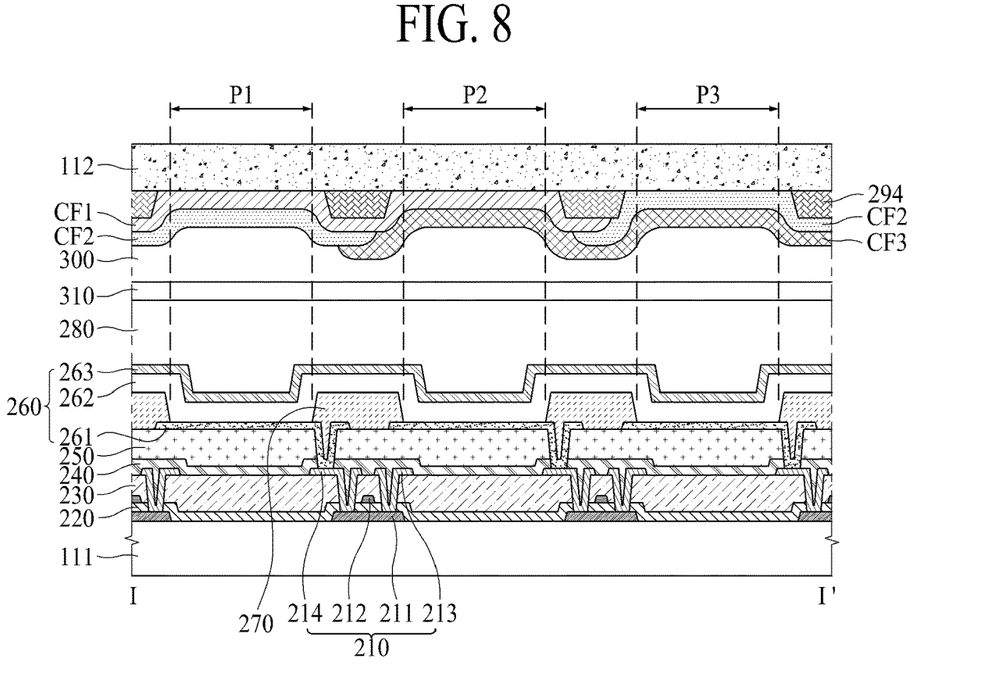
FIG. 8 is a cross-sectional view illustrating still another example of line I-I' of FIGS. 3 and 4.

Also, the first to third color filters CF1, CF2 and CF3 and the black matrix 294 may be formed on the second substrate 112 as shown in FIG. 8. In this situation, the overcoat layer 300 formed on the encapsulation film 280 of the first substrate 111 may be attached to the overcoat layer 300 formed on the first to third color filters CF1, CF2 and CF3 of the second substrate 112 by an adhesive layer 310. For this reason, the first substrate 111 and the second substrate 112 may be bonded to each other. The adhesive layer 310 may be a transparent adhesive resin or adhesive film.

Figure 9:
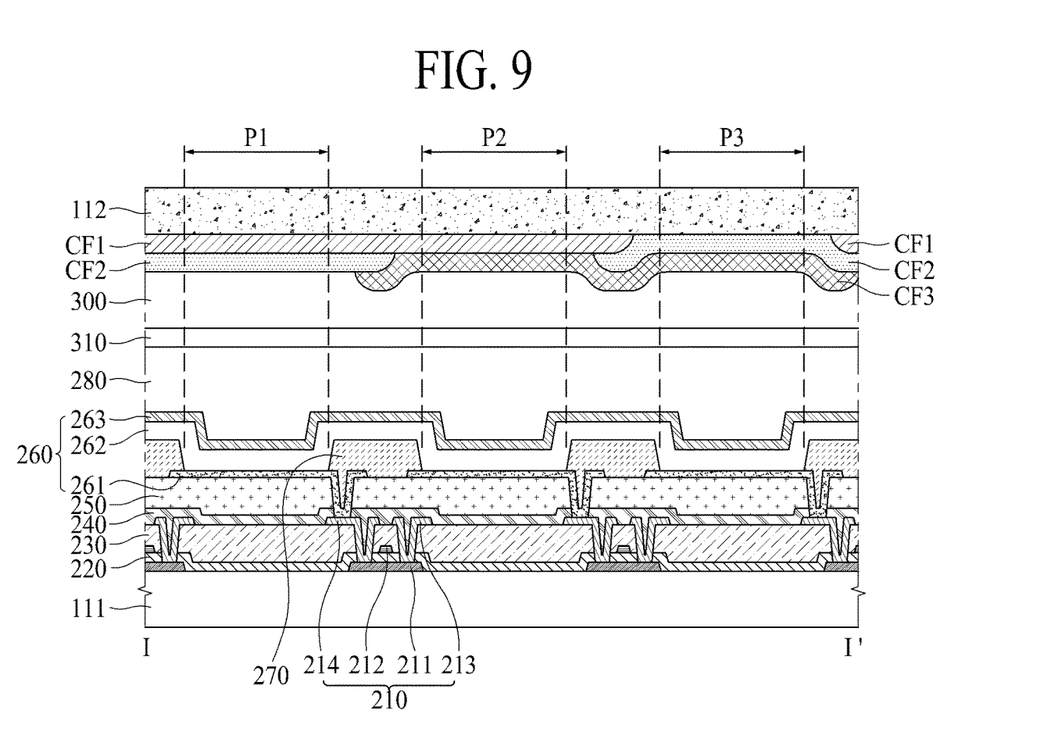
FIG. 9 is a cross-sectional view illustrating further still another example of line I-I' of FIGS. 3 and 4.

Also, the first to third color filters CF1, CF2 and CF3 except the black matrix 294 may only be formed on the second substrate 112 as shown in FIG. 9. The black matrix 294 may be arranged to overlap all of the first to third color filters CF1, CF2 and CF3 as shown in FIG. 8. In this situation, light of the organic light emitting layer 262 fails to transmit the first to third color filters CF1, CF2 and CF3. Therefore, since the areas where the first to third color filters CF1, CF2 and CF3 are overlapped with one another may serve to perform a function similar to that of the black matrix 294, the black matrix 294 may be omitted as shown in FIG. 9.

Figure 5A:
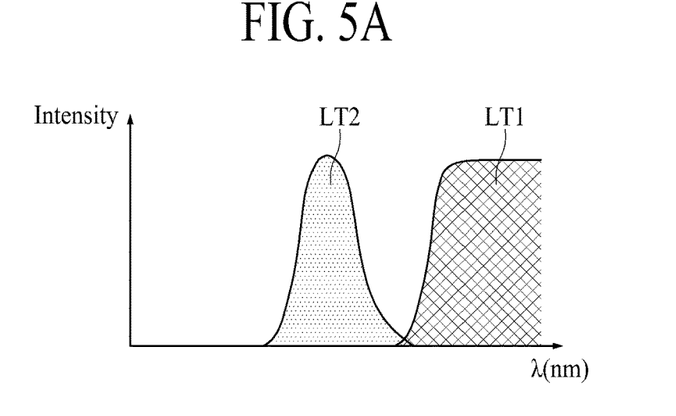
FIGS. 5A to 5C are graphs illustrating light transmissive ranges of first to third color filters of FIG. 4.
Figure 5B:
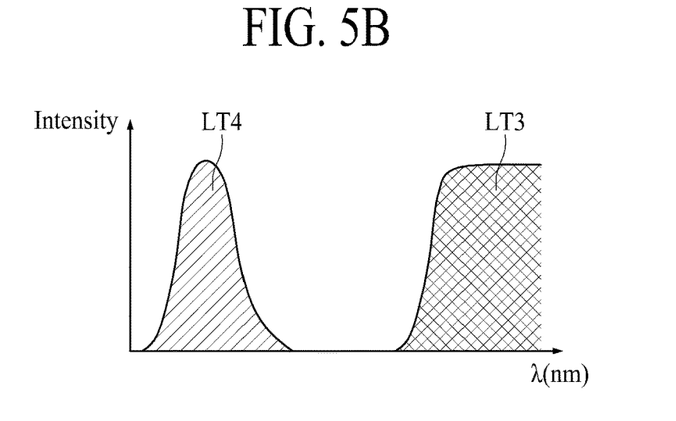
Figure 5C:
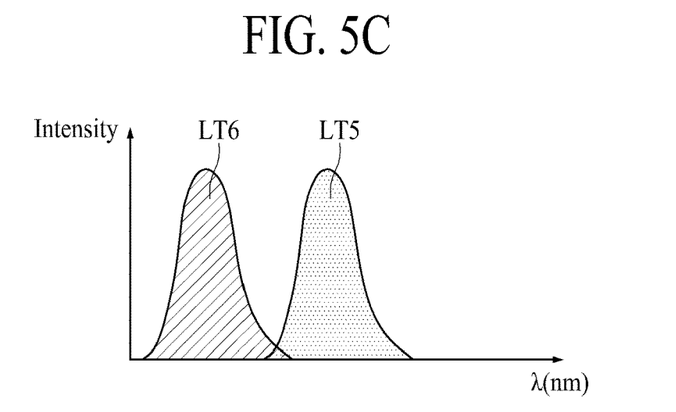
Figure 6A:
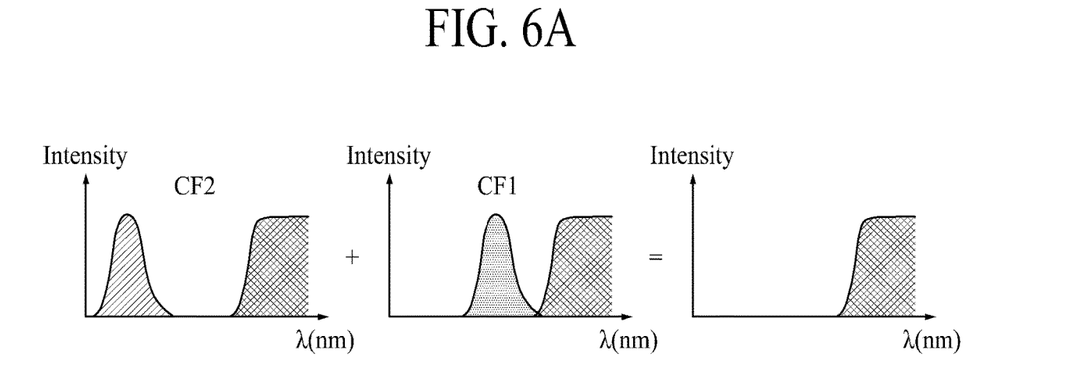
FIGS. 6A to 6C are graphs illustrating final light transmissive ranges according to combination of color filters per pixel.
Figure 6B:
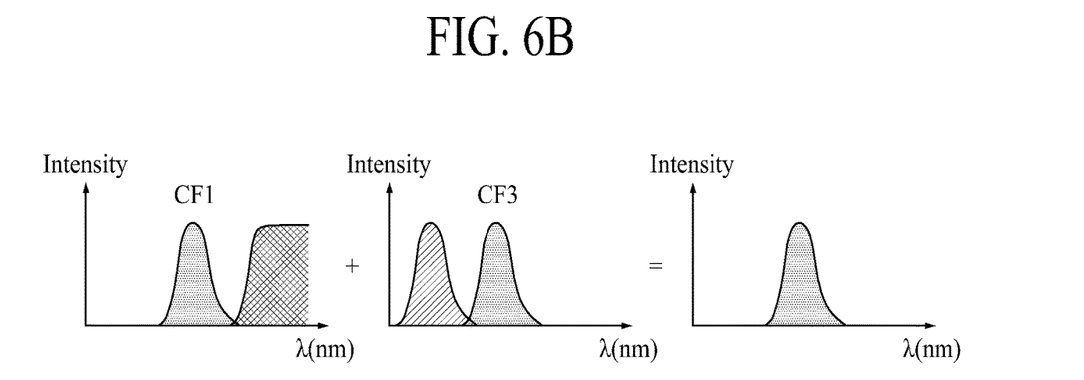
Figure 6C:
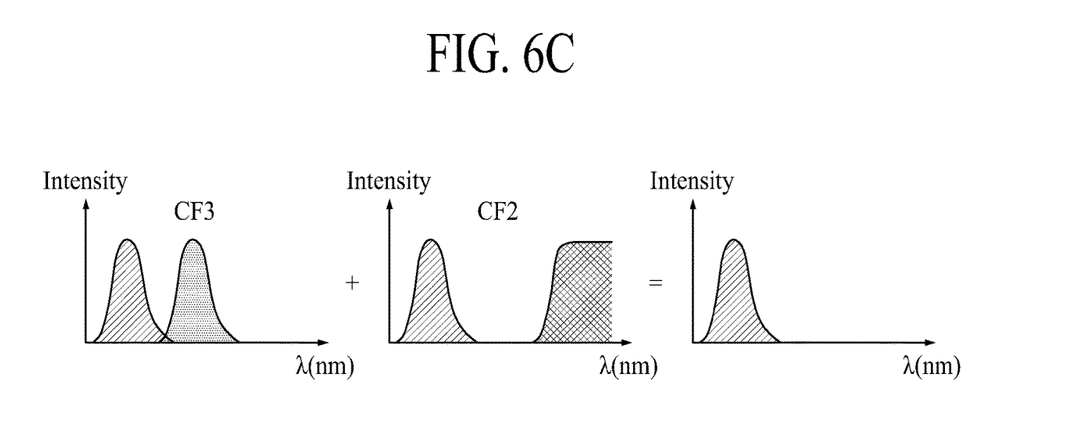

FIGS. 5A to 5C are graphs illustrating light transmissive ranges of first to third color filters of FIG. 4. FIGS. 6A to 6C are graphs illustrating final light transmissive ranges according to combination of color filters per pixel.

Hereinafter, light finally emitted by transmitting the first to third color filters CF1, CF2 and CF3 among light of the first to third pixels P1, P2 and P3 will be described in detail with reference to FIGS. 5A to 5C and FIGS. 6A to 6C.

The first color filter CF1 may transmit light of a first light transmissive wavelength range LT1 and a second light transmissive wavelength range LT2 as shown in FIG. 5A. The second color filter CF2 may transmit light of a third light transmissive wavelength range LT3 and a fourth light transmissive wavelength range LT4 as shown in FIG. 5B. The third color filter CF3 may transmit light of a fifth light transmissive wavelength range LT5 and a sixth light transmissive wavelength range LT6 as shown in FIG. 5C.

The first light transmissive wavelength range LT1 may be arranged in a long wavelength area rather than that of the second light transmissive wavelength range LT2, the third light transmissive wavelength range LT3 may be arranged in a long wavelength area rather than that of the fourth light transmissive wavelength range LT4, and the fifth light transmissive wavelength range LT5 may be arranged in a long wavelength area rather than that of the sixth light transmissive wavelength range LT6. Also, the first light transmissive wavelength range LT1 may be overlapped with the third light transmissive wavelength range LT3, the second light transmissive wavelength range LT2 may be overlapped with the fifth light transmissive wavelength range LT5, and the fourth light transmissive wavelength range LT4 may be overlapped with the sixth light transmissive wavelength range LT6.

The first light transmissive wavelength range LT1 and the third light transmissive wavelength range LT3 may be wavelength ranges for transmitting red light, the second light transmissive wavelength range LT2 and the fifth light transmissive wavelength range LT5 may be wavelength ranges for transmitting green light, and the fourth light transmissive wavelength range LT4 and the sixth light transmissive wavelength range LT6 may be wavelength ranges for transmitting blue light. In this situation, a peak wavelength of the first light transmissive wavelength range LT1 or a peak wavelength of the third light transmissive wavelength range LT3 may be in, but not limited to, the range of 640 nm to 700 nm, and a peak wavelength of the second light transmissive wavelength range LT2 or a peak wavelength of the fifth light transmissive wavelength range LT5 may be in, but not limited to, the range of 490 nm to 550 nm, and a peak wavelength of the fourth light transmissive wavelength range LT4 or a peak wavelength of the sixth light transmissive wavelength range LT6 may be in, but not limited to, the range of 420 nm to 480 nm.

The first pixel P1 is overlapped with the first color filter CF1 and the second color filter CF2. In this situation, as shown in FIG. 6A, among the light emitted from the first pixel P1, the light that has passed through the first light transmissive wavelength range LT1 of the first color filter CF1 and the third light transmissive wavelength range LT3 of the second color filter CF2 may be output.

Also, the second pixel P2 is overlapped with the first color filter CF1 and the third color filter CF3. In this situation, as shown in FIG. 6B, among the light emitted from the second pixel P2, the light that has passed through the second light transmissive wavelength range LT2 of the first color filter CF1 and the fifth light transmissive wavelength range LT5 of the third color filter CF3 may be output.

Also, the third pixel P3 is overlapped with the second color filter CF2 and the third color filter CF3. In this situation, as shown in FIG. 6C, among the light emitted from the third pixel P3, the light that has passed through the fourth light transmissive wavelength range LT4 of the second color filter CF2 and the sixth light transmissive wavelength range LT6 of the third color filter CF3 may be output.

As described above, in embodiments of the present invention, even though the first to third color filters CF1, CF2 and CF3 are arranged to overlap the first to third pixels P1, P2 and P3, the light of the first color, which has passed through the first light transmissive wavelength range LT1 of the first color filter CF1 and the third light transmissive wavelength range LT3 of the second color filter CF2, may be output from the first pixel P1, the light of the second color, which has passed through the second light transmissive wavelength range LT2 of the first color filter CF1 and the fifth light transmissive wavelength range LT5 of the third color filter CF3, may be output from the second pixel P2, and the light of the third color, which has passed through the fourth light transmissive wavelength range LT4 of the second color filter CF2 and the sixth light transmissive wavelength range LT6 of the third color filter CF3, may be output from the third pixel P3. In addition, the light of the first color may be red light, the light of the second color may be green light, and the light of the third color may be blue light. In this situation, the first color filter CF1 may be, but not limited to, a yellow color filter, the second color filter CF2 may be, but not limited to, a magenta color filter, and the third color filter CF3 may be, but not limited to, a cyan color filter.

As described above, according to embodiments of the present invention, the following advantages may be obtained.

The color filters may be formed to overlap the plurality of pixels, whereby each width of the color filters may be widened. Since adhesion of each color filter depends on an area of the color filter, the color filter may be formed with a wide width to enhance its adhesion. Therefore, in the embodiment of the present invention, the color filter may be prevented from being peeled away or torn out.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents. Thus, the above embodiments are to be considered in all respects as illustrative and not restrictive. The scope of the invention should be determined by reasonable interpretation of the appended claims and all change which comes within the equivalent scope of the invention are included in the scope of the invention.

What is claimed is:

1. A display device comprising:
   a plurality of pixels including a first pixel, a second pixel and a third pixel, wherein each of the first to third pixels includes:
      a thin film transistor layer disposed on a first substrate,
      a first electrode connected to the thin film transistor layer,
      an organic light emitting layer disposed on the first electrode, and
      a second electrode disposed on the organic light emitting layer;
   an encapsulation film disposed on the second electrode and covering the second electrode;
   a color filter layer disposed on the encapsulation film, wherein the color filter layer includes:
      a first color filter overlapping the first and second pixels,
      a second color filter overlapping the first and third pixels,
      a third color filter overlapping the second and third pixels, and
      an overcoat layer disposed on the first, second and third color filters;
   a second substrate disposed on the overcoat layer;
   a bank disposed between two adjacent pixels among the first, second and third pixels; and
   a protrusion including overlapping portions of the first, second and third color filters, the protrusion extending away from the encapsulation film in a direction toward the overcoat layer,
   wherein the encapsulation film contacts at least two of the first, second and third color filters,
   wherein a center of the protrusion overlaps with the bank and the thin film transistor,
   wherein the bank is disposed between the protrusion and the thin film transistor, and
   wherein a gate electrode of the thin film transistor overlaps with both of the bank and the protrusion.

2. The display device of claim 1, wherein the first color filter is configured to pass light of a first light transmissive wavelength range and a second light transmissive wavelength range, the second color filter is configured to pass light of a third light transmissive wavelength range and a fourth light transmissive wavelength range, and the third color filter configured to pass light of a fifth light transmissive wavelength range and a sixth light transmissive wavelength range.

3. The display device of claim 2, wherein the first light transmissive wavelength range overlaps with the third light transmissive wavelength range, the second light transmissive wavelength range overlaps with the fifth light transmissive wavelength range, and the fourth light transmissive wavelength range overlaps with the sixth light transmissive wavelength range.

4. The display device of claim 3, wherein the first light transmissive wavelength range includes longer wavelengths than the second light transmissive wavelength range, the third light transmissive wavelength range includes longer wavelengths than the fourth light transmissive wavelength range, and the fifth light transmissive wavelength range includes longer wavelengths than the sixth light transmissive wavelength range.

5. The display device of claim 1, further comprising a black matrix disposed at a boundary between the first and second color filters, a boundary between the second and third color filters, and a boundary between the first and third color filters.

6. The display device of claim 5, wherein the first color filter is disposed on the black matrix, the second color filter is disposed on the black matrix and the first color filter, and the third color filter is disposed on the first and second color filters.

7. The display device of claim 5, wherein the black matrix overlaps with the first color filter, the second color filter and the third color filter.

8. The display device of claim 5, wherein the bank partitions the first to third pixels, wherein the black matrix overlaps with the bank, and
wherein a width of the black matrix is narrower than a width of the bank.

9. The display device of claim 1, further comprising:
a planarization film disposed between the thin film transistor and the plurality of pixels; and
a contact hole extending through the planarization film, wherein the first electrode extends through the contact hole and is connected to the thin film transistor, and
wherein the contact hole overlaps with both of the bank and the protrusion.

10. The display device of claim 1, wherein a portion of the bank fills a portion of the contact hole.

11. The display device of claim 1, wherein portions of the thin film transistor overlap with the first electrode in each of two adjacent pixels among the plurality of pixels.

12. The display device of claim 1, wherein portions of an active layer of the thin film transistor overlap with the first electrode in each of two adjacent pixels among the plurality of pixels.

13. An organic light emitting display device comprising:
a unit pixel including a red subpixel, a green subpixel and a blue subpixel, wherein each of the red, green and blue subpixels includes:
a thin film transistor layer disposed on a first substrate,
a first electrode connected to the thin film transistor layer,
an organic light emitting layer disposed on the first electrode, and
a second electrode disposed on the organic light emitting layer;
an encapsulation film disposed on the second electrode and covering the second electrode;
a color filter layer disposed on the encapsulation film, wherein the color filter layer includes:
a first color filter extending across the red and green subpixels and configured to pass a first light transmissive wavelength range including red light and a second light transmissive wavelength range including green light,
a second color filter overlapping with the red and blue subpixels, and configured to pass a third light transmissive wavelength range including red light and a fourth light transmissive wavelength range including blue light,
a third color filter extending across the green and blue subpixels and configured to pass a fifth light transmissive wavelength range including green light and a sixth light transmissive wavelength range including blue light, and
an overcoat layer disposed on the first, second and third color filters;
a second substrate disposed on the overcoat layer;
a bank disposed between two adjacent pixels among the first, second and third pixels; and
a protrusion including overlapping portions of the first, second and third color filters, the protrusion extending away from the encapsulation film in a direction toward the overcoat layer,
wherein the encapsulation film contacts at least two of the first, second and third color filters,
wherein a center of the protrusion overlaps with the bank and the thin film transistor,
wherein the bank is disposed between the protrusion and the thin film transistor, and
wherein a gate electrode of the thin film transistor overlaps with both of the bank and the protrusion.

14. The organic light emitting display device of claim 13, wherein a first overlapping portion where the first color filter overlaps with the second color filter is disposed in the red subpixel and the first overlapping portion is configured to block light within the second, fourth, fifth and sixth light transmissive wavelength ranges,
wherein a second overlapping portion where the first color filter overlaps with the third color filter is disposed in the green subpixel and the second overlapping portion is configured to block light within the first, third, fourth and sixth light transmissive wavelength ranges, and
wherein a third overlapping portion where the second color filter overlaps with the third color filter is disposed in the blue subpixel and the third overlapping portion is configured to block light within the first, second, third and fifth transmissive wavelength ranges.

15. The organic light emitting display device of claim 13, wherein the first light transmissive wavelength range overlaps with the third light transmissive wavelength range, the second light transmissive wavelength range overlaps with the fifth light transmissive wavelength range, and the fourth light transmissive wavelength range overlaps with the sixth light transmissive wavelength range.

16. The organic light emitting display device of claim 13, further comprising a black matrix disposed between two adjacent subpixels among the red, green and blue subpixels.

17. The organic light emitting display device of claim 16, wherein the black matrix overlaps with the first, second and third color filters.

18. The organic light emitting display device of claim 13, wherein the organic light emitting layer includes:
a first organic light emitting layer portion in the red subpixel;
a second organic light emitting layer portion in the green subpixel; and
a third organic light emitting layer portion in the blue subpixel.

19. A display device comprising:
a unit pixel including a red subpixel, a green subpixel and a blue subpixel, wherein each of the red, green and blue subpixels includes:
a thin film transistor layer disposed on a first substrate,
a first electrode connected to the thin film transistor layer, an organic light emitting layer disposed on the first electrode, and a second electrode disposed on the organic light emitting layer, an encapsulation film disposed on the second electrode and covering the second electrode;

a color filter layer disposed on the encapsulation film, wherein the color filter layer includes:

a first color filter extending across the red and green subpixels and configured to pass a first light transmissive wavelength range including red light and a second light transmissive wavelength range including green light, a second color filter overlapping with the red and blue subpixels, and configured to pass a third light transmissive wavelength range including red light and a fourth light transmissive wavelength range including blue light, a third color filter extending across the green and blue subpixels and configured to pass a fifth light transmissive wavelength range including green light and a sixth light transmissive wavelength range including blue light, and an overcoat layer disposed on the first, second and third color filters;

a second substrate disposed on the overcoat layer;

a bank disposed between two adjacent pixels among the first, second and third pixels; and a protrusion including overlapping portions of the first, second and third color filters, the protrusion extending away from the encapsulation film in a direction toward the overcoat layer, wherein the encapsulation film contacts at least two of the first, second and third color filters, wherein a first overlapping portion where the first color filter overlaps with the second color filter is disposed in the red subpixel and the first overlapping portion is configured to block light within the second, fourth, fifth and sixth light transmissive wavelength ranges, wherein a second overlapping portion where the first color filter overlaps with the third color filter is disposed in the green subpixel and the second overlapping portion is configured to block light within the first, third, fourth and sixth light transmissive wavelength ranges, wherein a third overlapping portion where the second color filter overlaps with the third color filter is disposed in the blue subpixel and the third overlapping portion is configured to block light within the first, second, third and fifth transmissive wavelength ranges, wherein a center of the protrusion overlaps with the bank and the thin film transistor, wherein the bank is disposed between the protrusion and the thin film transistor, and wherein a gate electrode of the thin film transistor overlaps with both of the bank and the protrusion.

* * * * *